United States Patent
Jo et al.

(10) Patent No.: US 10,475,487 B2
(45) Date of Patent: Nov. 12, 2019

(54) DATA DRIVER AND DISPLAY APPARATUS HAVING THE SAME

(71) Applicant: Samsung Display Co., Ltd., Yongin-Si, Gyeonggi-Do (KR)

(72) Inventors: Guhui Jo, Suwon-si (KR); Wontae Kim, Hwaseong-si (KR); Sun-koo Kang, Seoul (KR); Taegon Im, Gwangmyeong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 28 days.

(21) Appl. No.: 15/914,004

(22) Filed: Mar. 7, 2018

(65) Prior Publication Data
US 2019/0051337 A1   Feb. 14, 2019

(30) Foreign Application Priority Data
Aug. 11, 2017 (KR) .......... 10-2017-0102610

(51) Int. Cl.
*G09G 3/36* (2006.01)
*G09G 3/3275* (2016.01)
(Continued)

(52) U.S. Cl.
CPC .......... *G11C 7/1087* (2013.01); *G09G 3/3677* (2013.01); *G09G 3/3688* (2013.01); *G09G 3/3275* (2013.01); *G09G 3/3291* (2013.01); *G09G 3/3611* (2013.01); *G09G 3/3696* (2013.01); *G09G 5/001* (2013.01); *G09G 2310/08* (2013.01); *G09G 2320/0233* (2013.01); *G11C 7/10* (2013.01)

(58) Field of Classification Search
CPC ...... G09G 3/20; G09G 3/3275; G09G 3/3291; G09G 3/3611; G09G 3/3677; G09G 3/3688; G09G 3/3696; G09G 2300/0413; G09G 2310/027; G09G 2310/0275; G09G 2310/0291; G09G 2310/0297; G09G 2310/08; G09G 2310/0286; G09G 2320/0233; G09G 5/0001; G11C 7/10; G11C 7/1087
See application file for complete search history.

(56) References Cited

U.S. PATENT DOCUMENTS 7,821,487 B2   10/2010   Tanaka et al.
9,589,522 B2 *  3/2017   Shin ............ G09G 3/3648
(Continued)

FOREIGN PATENT DOCUMENTS

JP   4869706 B2   2/2012
KR   100880221 B1   1/2009
(Continued)

*Primary Examiner* — Michael J Eurice
(74) *Attorney, Agent, or Firm* — Cantor Colburn LLP

(57) ABSTRACT

A data driver includes a first latch, a second latch, a digital-to-analog converter, and an output buffer. The first latch sequentially stores first line data in response to a first sampling signal and outputs the stored data in parallel. The second latch sequentially stores second line data in response to a second sampling signal and outputs the stored data in parallel. The digital-to-analog converter converts the parallel data provided from one of the first and second latches to data voltages. The output buffer outputs the data voltages in response to a delay clock.

20 Claims, 9 Drawing Sheets

(51) Int. Cl.
*G11C 7/10* (2006.01)
*G09G 5/00* (2006.01)
*G09G 3/3291* (2016.01)

(56) References Cited

U.S. PATENT DOCUMENTS

| | | | | |
|---|---|---|---|---|
| 9,754,546 B2* | 9/2017 | Kim | | G09G 3/3648 |
| 10,001,886 B2* | 6/2018 | Han | | G06F 3/044 |
| 2002/0190973 A1* | 12/2002 | Morita | | G09G 3/3614 |
| | | | | 345/204 |
| 2002/0196243 A1* | 12/2002 | Morita | | G09G 3/3611 |
| | | | | 345/204 |
| 2003/0090451 A1* | 5/2003 | Ahn | | G09G 3/3688 |
| | | | | 345/96 |
| 2004/0125067 A1* | 7/2004 | Kim | | G09G 3/3614 |
| | | | | 345/98 |
| 2004/0160402 A1* | 8/2004 | Kim | | G09G 3/3696 |
| | | | | 345/89 |
| 2004/0227744 A1* | 11/2004 | Toriumi | | G09G 3/3648 |
| | | | | 345/204 |
| 2005/0128169 A1* | 6/2005 | Kang | | G09G 3/20 |
| | | | | 345/87 |
| 2006/0001638 A1* | 1/2006 | Jeon | | G09G 3/3677 |
| | | | | 345/100 |
| 2007/0085801 A1* | 4/2007 | Park | | G09G 3/3611 |
| | | | | 345/98 |
| 2007/0097757 A1* | 5/2007 | Ha | | G09G 3/3655 |
| | | | | 365/189.09 |
| 2007/0146394 A1* | 6/2007 | Ahn | | G09G 3/3208 |
| | | | | 345/690 |
| 2008/0001876 A1* | 1/2008 | Ito | | G09G 3/3655 |
| | | | | 345/87 |
| 2008/0211790 A1* | 9/2008 | Jung | | G09G 3/3688 |
| | | | | 345/204 |
| 2009/0015574 A1* | 1/2009 | Kim | | G09G 3/3688 |
| | | | | 345/208 |
| 2010/0090992 A1* | 4/2010 | Lee | | G09G 3/3688 |
| | | | | 345/204 |
| 2010/0277494 A1* | 11/2010 | Cho | | G09G 3/3614 |
| | | | | 345/589 |
| 2011/0316821 A1* | 12/2011 | Suzuki | | G09G 3/3688 |
| | | | | 345/204 |
| 2014/0035897 A1* | 2/2014 | Lee | | G09G 3/3696 |
| | | | | 345/212 |
| 2014/0125639 A1* | 5/2014 | Cho | | G09G 3/20 |
| | | | | 345/204 |
| 2014/0300654 A1* | 10/2014 | Kim | | G09G 5/008 |
| | | | | 345/691 |
| 2014/0306872 A1* | 10/2014 | Yun | | G09G 3/3618 |
| | | | | 345/99 |
| 2014/0347404 A1* | 11/2014 | Lee | | G09G 5/18 |
| | | | | 345/690 |
| 2015/0103038 A1* | 4/2015 | Han | | G06F 3/044 |
| | | | | 345/174 |
| 2015/0179107 A1* | 6/2015 | Kim | | G09G 3/3233 |
| | | | | 345/212 |
| 2015/0187304 A1* | 7/2015 | Ko | | G09G 3/3648 |
| | | | | 345/208 |
| 2016/0117991 A1* | 4/2016 | Ha | | G09G 3/3291 |
| | | | | 345/78 |
| 2016/0224175 A1* | 8/2016 | Moon | | G06F 3/0412 |
| 2016/0351090 A1* | 12/2016 | Jung | | G09G 3/20 |
| 2016/0351099 A1* | 12/2016 | Kim | | G09G 3/2044 |
| 2016/0365066 A1 | 12/2016 | Lim et al. | | |
| 2016/0372044 A1* | 12/2016 | Kwon | | G09G 3/3291 |
| 2017/0004776 A1* | 1/2017 | Park | | G09G 3/3233 |
| 2017/0102824 A1* | 4/2017 | Kang | | G06F 3/0412 |
| 2017/0323611 A1 | 11/2017 | Jo et al. | | |
| 2018/0059832 A1* | 3/2018 | Cho | | G09G 3/3648 |
| 2018/0096666 A1* | 4/2018 | Chung | | G09G 3/3688 |

FOREIGN PATENT DOCUMENTS

| | | |
|---|---|---|
| KR | 1020160083368 A | 7/2016 |
| KR | 1020160147202 A | 12/2016 |

* cited by examiner

DATA DRIVER AND DISPLAY APPARATUS HAVING THE SAME

This application claims priority to Korean Patent Application No. 10-2017-0102610, filed on Aug. 11, 2017, and all the benefits accruing therefrom under 35 U.S.C. § 119, the content of which in its entirety is hereby incorporated by reference.

BACKGROUND

1. Field of Disclosure

Exemplary embodiments of the invention relate to a data driver and a display apparatus having the same. More particularly, the invention relates to a data driver capable of improving a poor charging issue caused by a signal delay and a display apparatus having the data driver.

2. Description of the Related Art

In general, a display apparatus includes a display panel displaying an image and data and gate drivers driving the display panel. The display panel includes gate lines, data lines, and pixels.

The data driver outputs a data driving signal to the data lines, and the gate driver outputs a gate driving signal to drive the gate lines. The display apparatus displays the image by applying a gate signal to the pixels connected to the gate lines and using a data voltage corresponding to the image.

SUMMARY

As a size of the display panel increases and the display panel is driven at high speed, the gate signal output from the gate driver is delayed in a path for the gate signal. In this case, a charging rate of the pixels located far from the gate driver is lower than a charging rate of the pixels located near the gate driver.

As a result, the image quality becomes uneven in one display panel. In addition, in a case that the data driver is mounted after being separated into plural chips, a dim phenomenon occurs at boundaries between display areas, which are driven by different chips from each other, due to a signal delay deviation between the chips.

The invention provides a data driver capable of improving a poor charging issue caused by a signal delay.

The invention provides a display apparatus capable of effectively improving a signal delay deviation between a plurality of data drivers.

According to an exemplary embodiment of the inventive concept, a data driver includes a first latch, a second latch, a digital-to-analog converter, and an output buffer. The first latch sequentially stores first line data in response to a first sampling signal and outputs the stored data in parallel, the second latch sequentially stores second line data in response to a second sampling signal and outputs the stored data in parallel, the digital-to-analog converter converts the parallel data provided from one of the first and second latches to data voltages, and an output buffer outputs the data voltages in response to a delay clock. According to an exemplary embodiment of the inventive concept, a display apparatus includes a display panel, a gate driver, a plurality of data drivers, and a signal controller. The display panel includes a plurality of gate lines, a plurality of data lines, and a plurality of pixels connected to the gate lines and the data lines to display an image. The gate driver generates a plurality of gate signals and applies the gate signals to the gate lines. The plurality of data drivers generates a plurality of data voltages based on output image data and applies the data voltages to the data lines. The signal controller controls an operation of the gate driver and the data drivers and generates the output image data based on input image data. Each of the data drivers includes first to j-th channels connected to corresponding data lines among the data lines. Each of the data drivers generates first to j-th delay clock signals in which delay information is reflected respectively and which correspond to the first to j-th channels and provides the first to j-th delay clock signals to a next data driver in order among the data drivers.

According to an exemplary embodiment of the inventive concept, a display apparatus includes a display panel, a gate driver, a plurality of data drivers, and a signal controller. The display panel includes a plurality of gate lines, a plurality of data lines, and a plurality of pixels connected to the gate lines and the data lines to display an image. The gate driver generates a plurality of gate signals and applies the gate signals to the gate lines. The data drivers generate a plurality of data voltages based on output image data and apply the data voltages to the data lines. The signal controller controls an operation of the gate driver and the data drivers and generates the output image data based on input image data. Each of the data drivers includes first to j-th channels, a first latch, a second latch, a digital-to-analog converter, and an output buffer. The first to j-th channels are connected to corresponding data lines among the data lines. The first latch sequentially stores first line data in response to a first sampling signal and outputs the stored data in parallel, and the second latch sequentially stores second line data in response to a second sampling signal and outputs the stored data in parallel. The digital-to-analog converter converts the parallel data provided from one of the first and second latches to data voltages, and the output buffer outputs the data voltages in response to a delay clock.

According to the above, since the data driver includes two latches, a phenomenon in which some of the first line data are changed to the second line data does not occur even though the delay occurs. Accordingly, the data voltage on which the delay time is reflected may be normally output during each horizontal period.

Since the delay information are transmitted between adjacent chips to each other to generate the delay clock signal of each chip, a dim phenomenon may be effectively prevented from occurring at boundaries between the display regions driven by different chips from each other.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
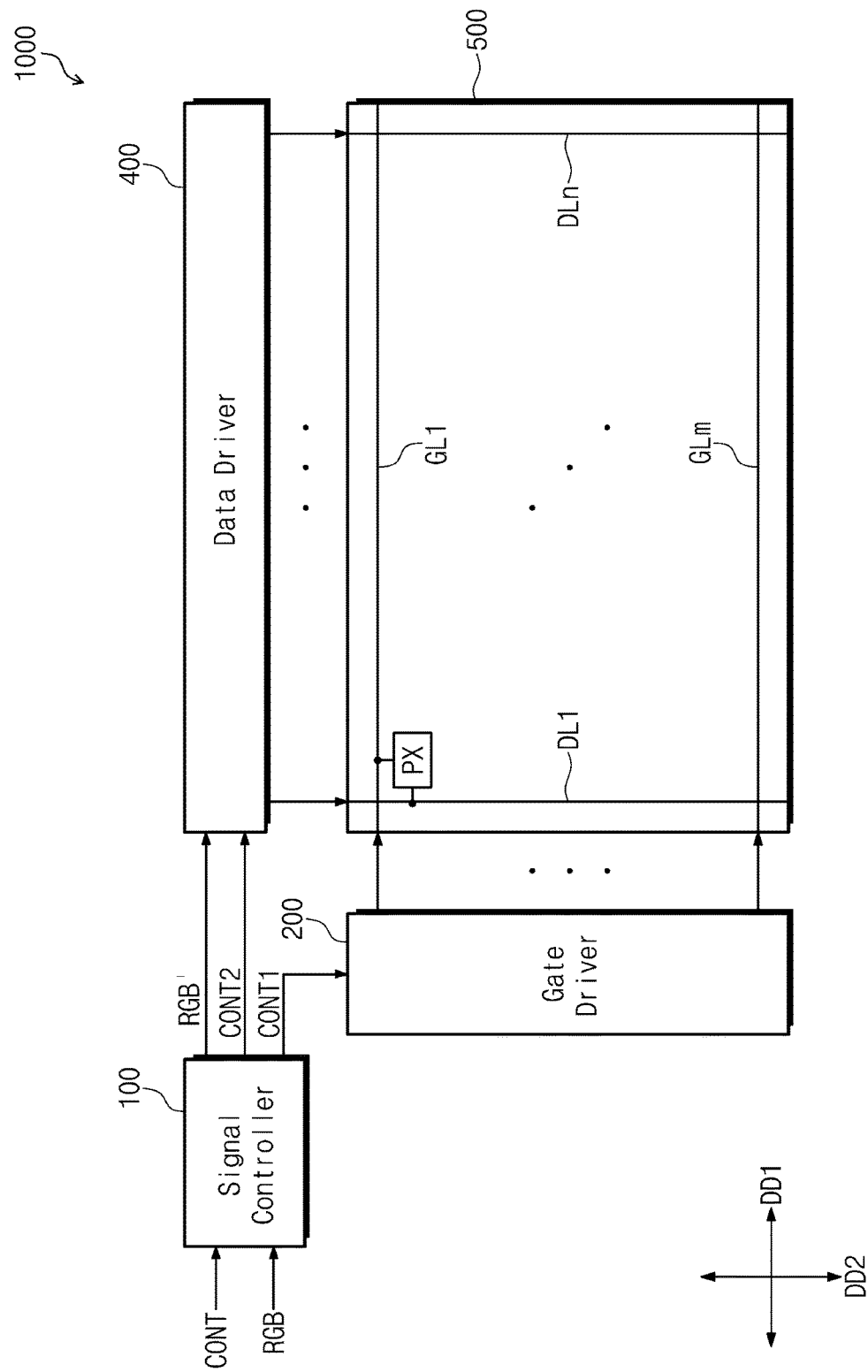
FIG. 1 is a block diagram showing an exemplary embodiment of a display apparatus according to the invention.

The invention may be variously modified and realized in many different forms, and thus specific exemplary embodiments will be exemplified in the drawings and described in detail hereinbelow. However, the invention should not be limited to the specific disclosed forms, and be construed to include all modifications, equivalents, or replacements included in the spirit and scope of the invention.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1 is a block diagram showing an exemplary embodiment of a display apparatus 1000 according to the invention.

Referring to FIG. 1, the display apparatus 1000 includes a signal controller 100, a gate driver 200, a data driver 400, and a display panel 500.

The display panel 500 includes a plurality of gate lines GL1 to GLm, a plurality of data lines DL1 to DLn, and a plurality of pixels PX connected to the gate lines GL1 to GLm and the data lines DL1 to DLn and which displays an image based on output image data RGB'. The gate lines GL1 to GLm extend in a first direction DD1, and the data lines DL1 to DLn extend in a second direction DD2 crossing the first direction DD1. The pixels PX may be arranged in a matrix form, and each of the pixels PX is electrically connected to one of the gate lines GL1 to GLm and one of the data lines DL1 to DLn.

The signal controller 100 controls an operation of the gate driver 200 and the data driver 400. The signal controller 100 receives input image data RGB and input control signals CONT from an external source (e.g., a host). The input image data RGB include red grayscale data R, green grayscale data G, and blue grayscale data B with respect to each of the pixels PX. The input control signals CONT may include a master clock signal, a data enable signal, a vertical synchronization signal, and a horizontal synchronization signal.

The signal controller 100 generates the output image data RGB', a first control signal CONT1, and a second control signal CONT2 based on the input image data RGB and the input control signals CONT.

In detail, the signal controller 100 generates the output image data RGB' based on the input image data RGB and provides the data driver 400 with the output image data RGB'. The output image data RGB' may be correction image data obtained by correcting the input image data RGB. According to exemplary embodiments, the signal controller 100 may perform an image quality correction, a spot correction, a color characteristic compensation, and/or an active capacitance compensation on the input image data RGB.

In addition, the signal controller 100 generates the first control signal CONT1 based on the input control signals CONT and provides the first control signal CONT1 to the gate driver 200 to control the operation of the gate driver 200. The first control signal CONT1 may include a vertical start signal and a gate clock signal. The signal controller 100 generates the second control signal CONT2 based on the input control signals CONT and provides the second control signal CONT2 to the data driver 400 to control the operation of the data driver 400. The second control signal CONT2 may include a horizontal start signal, a data clock signal, a data load signal, a polarity control signal, and an output control signal.

The gate driver 200 generates gate signals in response to the first control signal CONT1 to drive the gate lines GL1 to GLm. The gate driver 200 may sequentially apply the gate signals to the gate lines GL1 to GLm. Accordingly, the pixels PX may be sequentially driven in the unit of pixels connected to the same gate line (i.e., in the unit of pixel row).

The data driver 400 receives the second control signal CONT2 and the output image data RGB' from the signal controller 100. The data driver 400 generates data voltages in analog form based on the second control signal CONT2 and the output image data RGB' in digital form. The data driver 400 sequentially applies the data voltages to the data lines DL1 to DLn.

According to exemplary embodiments, the gate driver 200 and/or the data driver 400 may be mounted on the display panel 500 in the form of a chip or connected to the display panel 500 in the form of a tape carrier package ("TCP") or a chip-on-film ("COF"). According to other exemplary embodiments, the gate driver 200 and/or the data driver 400 may be directly integrated in the display panel 500.

The gate driver 200 is disposed at one side or both sides of the display panel 500 and sequentially applies the gate signals to the gate lines GL1 to GLm. FIG. 1 shows a structure in which the gate driver 200 is disposed at the one side of the display panel 500 and connected to one ends of the gate lines GL1 to GLm, but the structure of the display apparatus 1000 according to the invention should not be limited thereto or thereby. That is, in another exemplary embodiment, the display apparatus 1000 may have a dual gate structure in which the gate driver 200 is disposed to be connected to both ends of the gate lines GL1 to GLm.

As shown in FIG. 1, in the case that the gate driver 200 is connected to one ends of the gate lines GL1 to GLm, there is a difference in time between a time point at which the gate signal reaches the pixels disposed adjacent to the gate driver 200 and a time point (hereinafter, referred to as a "turn-on time point") at which the gate signal reaches the pixels disposed far from the gate driver 200.

In more detail, a turn-on time point at which a pixel (hereinafter, referred to as a "first pixel") connected to a first gate line GL1 and a first data line DL1 is turned on in response to the gate signal may be different from a turn-on time point at which a pixel (hereinafter, referred to as an "n-th pixel") connected to the first gate line GL1 and an n-th data line DLn is turned on in response to the gate signal. That is, the turn-on time point of the n-th pixel may be delayed than the turn-on time point of the first pixel by a predetermined time.

As described above, the difference in turn-on time points occurs between the pixels, depending on positions of the pixels. In addition, in the case that the difference in turn-on time points occurs between the pixels, a charge rate of the pixels, which are turned on relatively late, decreases. That is, the charge rate of the n-th pixel is lower than that of the first pixel.

As a size and a resolution of the display panel 500 increase, the difference in turn-on time points also increases. To reduce the decrease in the charge rate, time points at which the data voltages are output from the data driver 400 may be adjusted.

Figure 2:
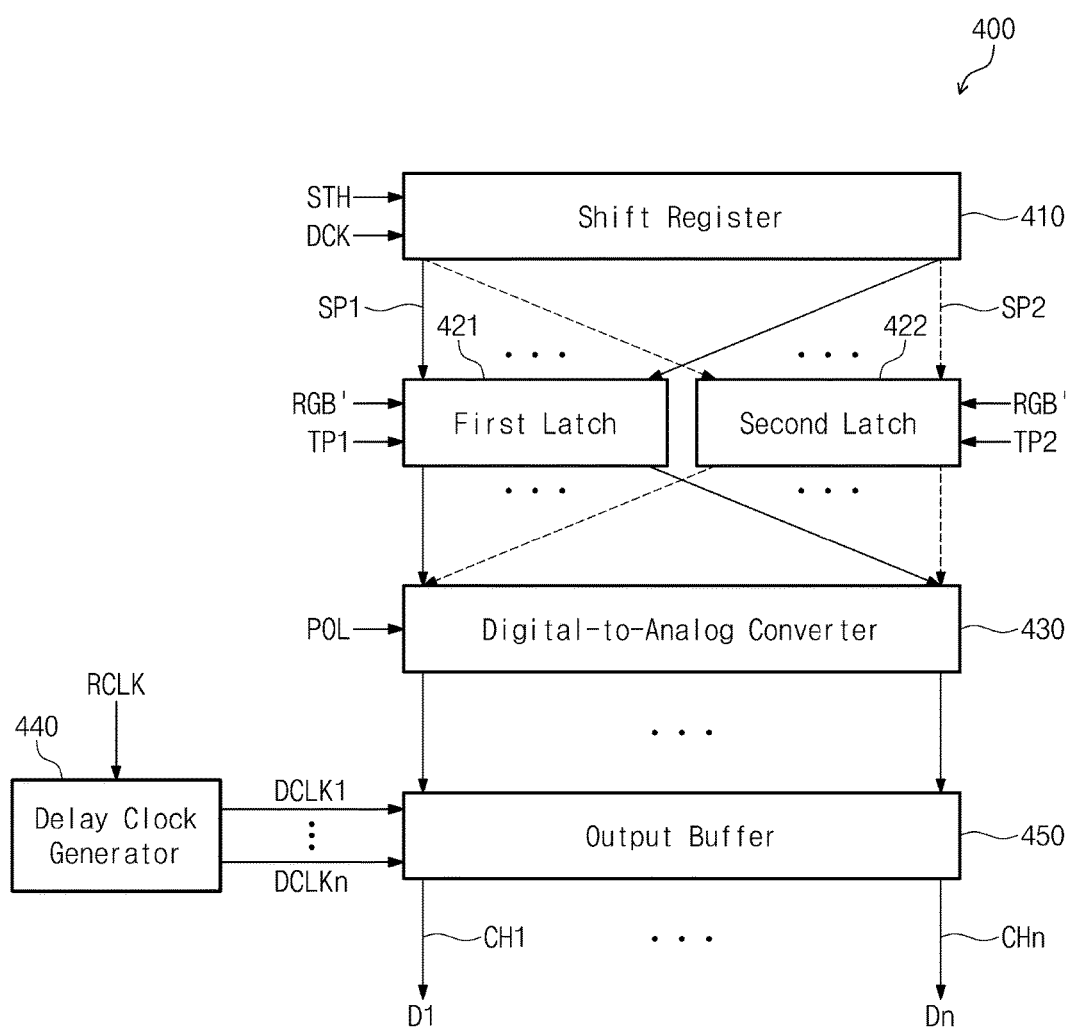
FIG. 2 is a block diagram showing an exemplary embodiment of a data driver shown in FIG. 1.

FIG. 2 is a block diagram showing an exemplary embodiment of the data driver 400 shown in FIG. 1.

Referring to FIG. 2, the data driver 400 includes a first latch 421, a second latch 422, a digital-to-analog converter 430, and an output buffer 440. The data driver 400 may further include a shift register 410.

The shift register 410 generates first sampling signals SP1 and/or second sampling signals SP2 in response to the horizontal start signal STH and the data clock signal DCK. The horizontal start signal STH and the data clock signal DCK may be included in the second control signal CONT2 (refer to FIG. 1) provided from the signal controller 100 (refer to FIG. 1).

The shift register 410 may alternately output the first and second sampling signals SP1 and SP2. In this case, the first sampling signals SP1 are defined as signals applied to the first latch 421, and the second sampling signals SP2 are defined as signals applied to the second latch 422. The first and second sampling signals SP1 and SP2 are generated at different time points, but may be substantially the same signals as each other.

The first latch 421 receives the output image data RGB' and sequentially stores first line data in response to the first sampling signal SP1. The first latch 421 outputs the stored data in parallel form based on a first data load signal TP1. The first data load signal TP1 may be included in the second control signal CONT2 (refer to FIG. 1). That is, the first latch 421 receives the first line data in serial form, but first parallel line data are output from the first latch 421.

The second latch 422 receives the output image data RGB' and sequentially stores second line data in response to the second sampling signal SP2. The second latch 422 outputs the stored data in parallel form based on a second data load signal TP2. The second data load signal TP2 may be included in the second control signal CONT2 (refer to FIG. 1). That is, the second latch 422 receives the second line data in serial form, but second parallel line data are output from the second latch 422.

The digital-to-analog converter 430 receives one of the first and second parallel line data from one of the first and second latches 421 and 422. The first and second parallel line data are provided in digital form, and the digital-to-analog converter 430 converts the first and second parallel line data to the data voltages in analog form.

The data voltages in analog form may have a positive polarity or a negative polarity based on the polarity control signal POL applied to the digital-to-analog converter 430. The polarity control signal POL may be included in the second control signal CONT2 (refer to FIG. 1). In an exemplary embodiment, the data voltages having the positive polarity may have a level higher than a level of a reference voltage and the data voltages having the negative polarity may have a level lower than the level of the reference voltage.

The data voltages generated by the digital-to-analog converter 430 are applied to the output buffer 450. The data voltages may include first to n-th data voltages D1 to Dn output to first to n-th channels CH1 to CHn of the output buffer 450, respectively.

The data driver 400 according to an exemplary embodiment may further include a delay clock generator 440 that generates first to n-th delay clock signals DCLK1 to DCLKn based on a predetermined reference clock RCLK and delay information of each of the first to n-th channels CH1 to CHn. The delay information of each of the first to n-th channels CH1 to CHn is stored in the delay clock generator 440 or provided from an external circuit, e.g., the signal controller 100.

The output buffer 450 receives the first to n-th delay clock signals DCLK1 to DCLKn from the delay clock generator 440. The output buffer 450 outputs the first to n-th data voltages D1 to Dn to the first to n-th channels CH1 to CHn in synchronization with the first to n-th delay clock signals DCLK1 to DCLKn, respectively. That is, responsive to the first to n-th delay clock signals DCLK1 to DCLKn, the output buffer 450 may determine time points at which the first to n-th data voltages D1 to Dn are output from the first to n-th channels CH1 to CHn, respectively.

The first to n-th channels CH1 to CHn of the output buffer 450 may be connected to the data lines DL1 to DLn (refer to FIG. 1), respectively. For instance, the output buffer 450 may output the first to n-th data voltages D1 to Dn to the data lines DL1 to DLn every one horizontal period. Here, the one horizontal period may indicate a time period in which one gate line among the gate lines is driven.

Figure 3:
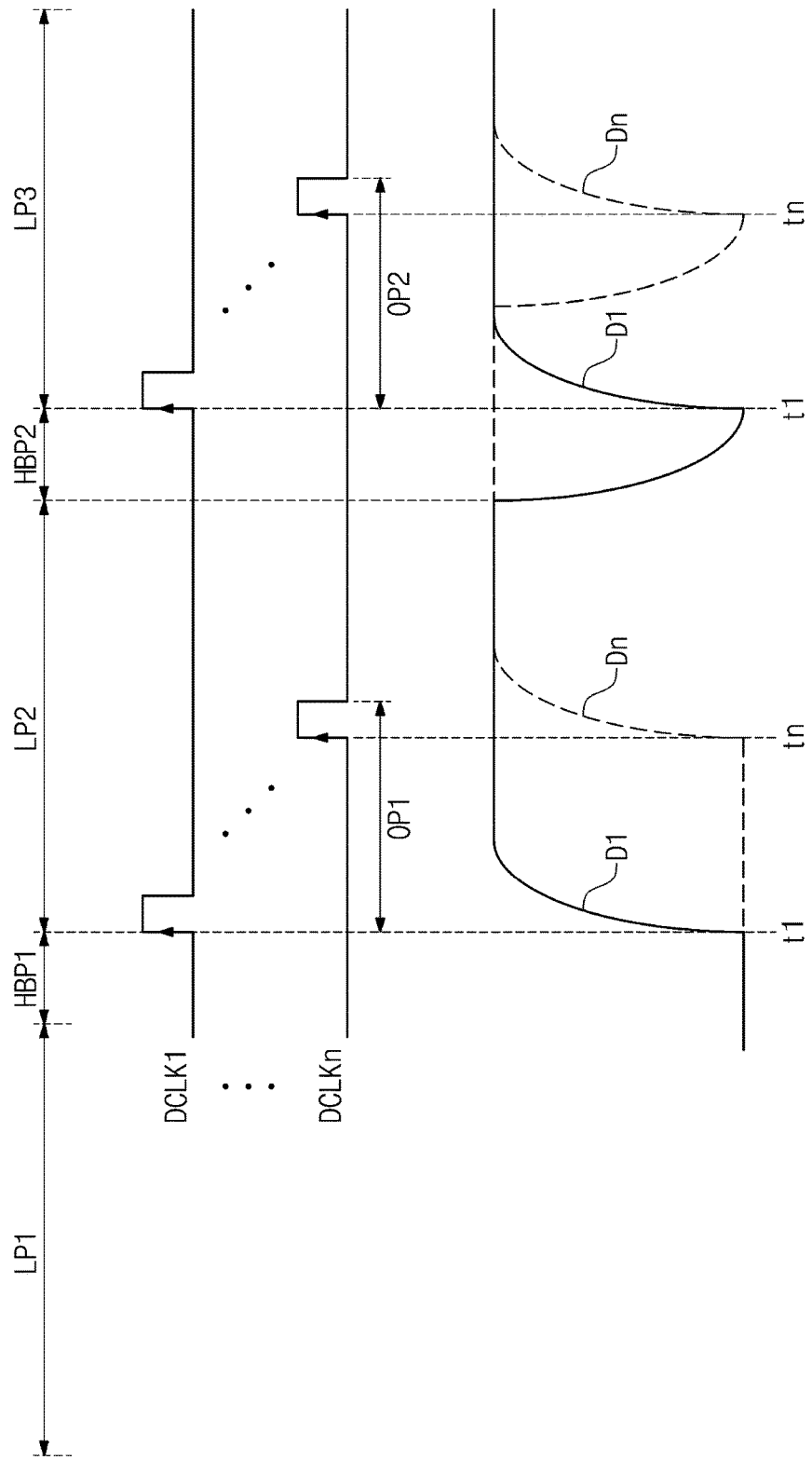
FIG. 3 is a waveform diagram explaining an exemplary embodiment of a latch operation of first and second latches.

FIG. 3 is a waveform diagram explaining an exemplary embodiment of a latch operation of the first and second latches 421 and 422 (refer to FIG. 2).

Referring to FIGS. 2 and 3, the first line data are stored in the first latch 421 (refer to FIG. 2) during a first latch period LP1. The first line data are the output image data corresponding to pixels connected to the same gate line among the output image data RGB'. The first line data correspond to the data voltages output from the data driver 400 (refer to FIG. 2) during the one horizontal period.

The output buffer 450 starts to output the data voltages generated based on the first parallel line data output from the first latch 421 during a first output period OP1. In detail, the first data voltage D1 starts to be output at a first rising time point t1 of the first delay clock signal DCLK1, and the n-th data voltage Dn starts to be output at a n-th rising time point to of the n-th delay clock signal DCLKn.

Then, the second line data are stored in the second latch 422 (refer to FIG. 2) during a second latch period LP2. The second line data are the output image data corresponding to pixels connected to the next gate line among the output image data RGB'. The second line data correspond to the data voltages output from the data driver 400 (refer to FIG. 2) during a next horizontal period.

A horizontal blanking period HBP1 exists between the first latch period LP1 and the second latch period LP2.

The first output period OP1 may overlap with the second latch period LP2 during which the second line data are stored in the second latch 422. In FIG. 3, the first output period OP1 does not overlap with the horizontal blank period HBP1, but the first output period OP1 may partially overlap with the horizontal blank period HBP1 according to other exemplary embodiments. That is, some delay clock signals of the first to n-th delay clock signals DCLK1 to DCLKn may be generated in the horizontal blank period HBP1, and the other delay clock signals among the first to n-th delay clock signals DCLK1 to DCLKn may be generated in the second latch period LP2.

That is, since the data driver 400 includes two separate latches 421 and 422, a phenomenon in which some of the first line data are changed to the second line data does not occur even though the first output period OP1 overlaps with the second latch period LP2. Accordingly, the data voltages generated based on the first line data may be normally output during the first output period OP1.

The output buffer 450 starts to output the data voltages generated based on the second parallel line data output from the second latch 422 during a second output period OP2. In detail, the first data voltage D1 starts to be output at the first rising time point t1 of the first delay clock signal DCLK1, and the n-th data voltage Dn starts to be output at the n-th rising time point to of the n-th delay clock signal DCLKn.

Then, third line data are stored in the first latch 421 (refer to FIG. 2) during a third latch period LP3. A horizontal blanking period HBP2 exists between the second latch period LP2 and the third latch period LP3. The third line data are the output image data corresponding to pixels connected to the gate line after the next gate line among the output image data RGB'. The third line data correspond to the data voltages output from the data driver 400 during the horizontal period after next horizontal period.

The second output period OP2 may overlap with the third latch period LP3 during which the third line data are stored in the first latch 421. In FIG. 3, the second output period OP2 does not overlap with the horizontal blank period HBP2, but the second output period OP2 may partially overlap with the horizontal blank period HBP2 according to other exemplary embodiments. That is, some delay clock signals of the first to n-th delay clock signals DCLK1 to DCLKn may be generated in the horizontal blank period HBP2, and the other delay clock signals among the first to n-th delay clock signals DCLK1 to DCLKn may be generated in the third latch period LP3.

Each of the first and second output periods OP1 and OP2 is defined as a period from a rising edge of the first delay clock signal DCLK1 to a falling edge of the n-th delay clock signal DCLKn.

Figure 4:
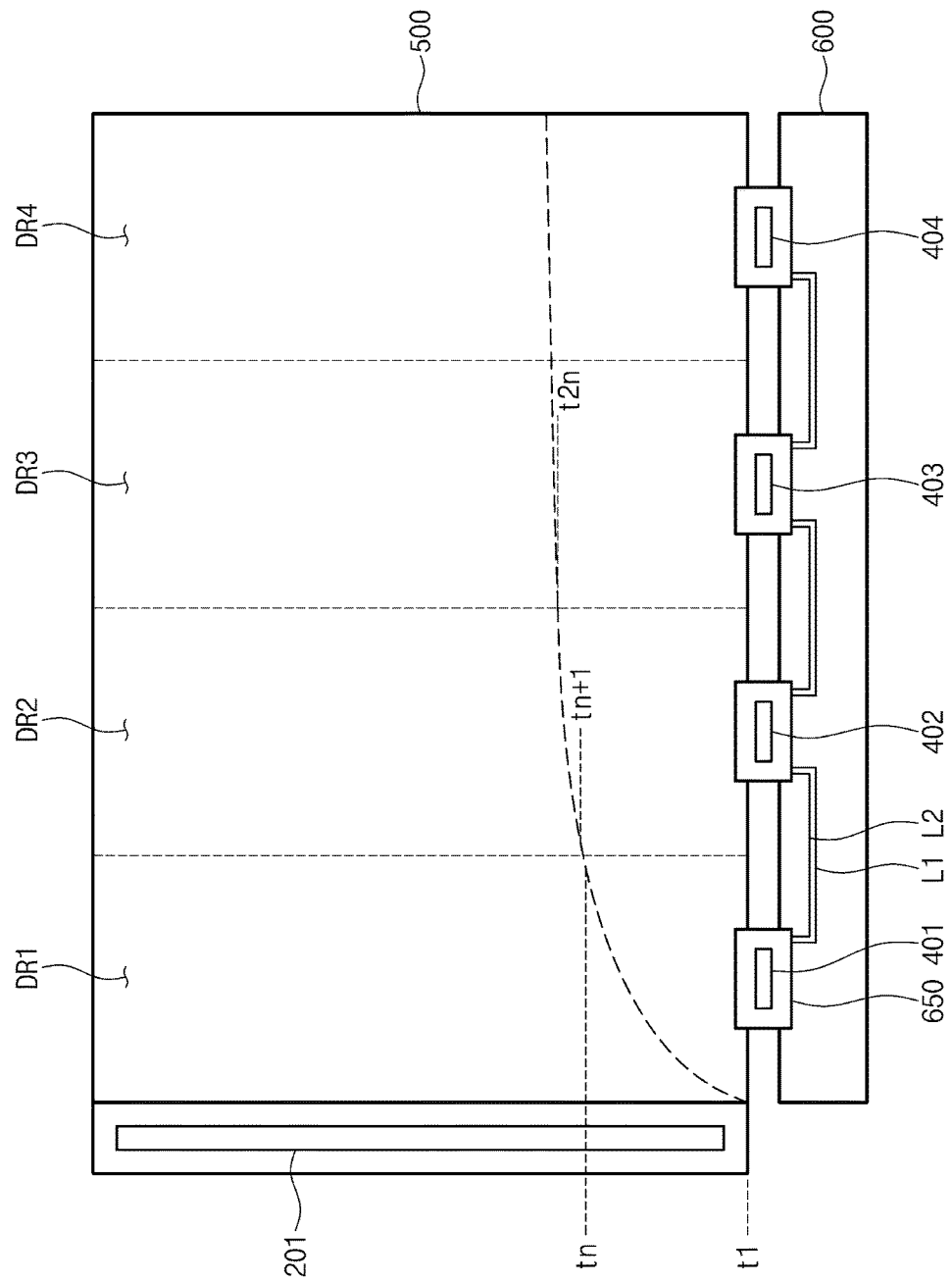
FIG. 4 is a block diagram showing another exemplary embodiment of a display apparatus according to the invention.
Figure 5A:
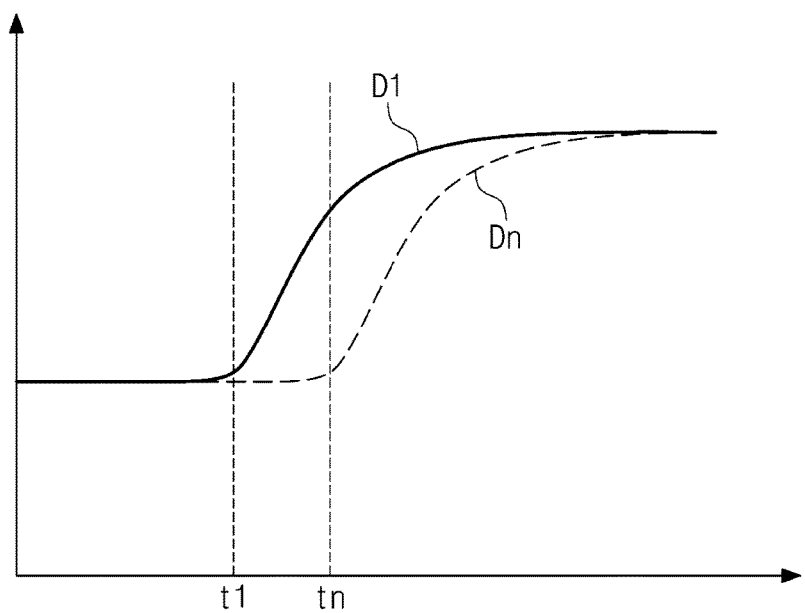
FIGS. 5A and 5B are waveform diagrams showing an exemplary embodiment of a delay of a data voltage output from first and second chips.
Figure 5B:
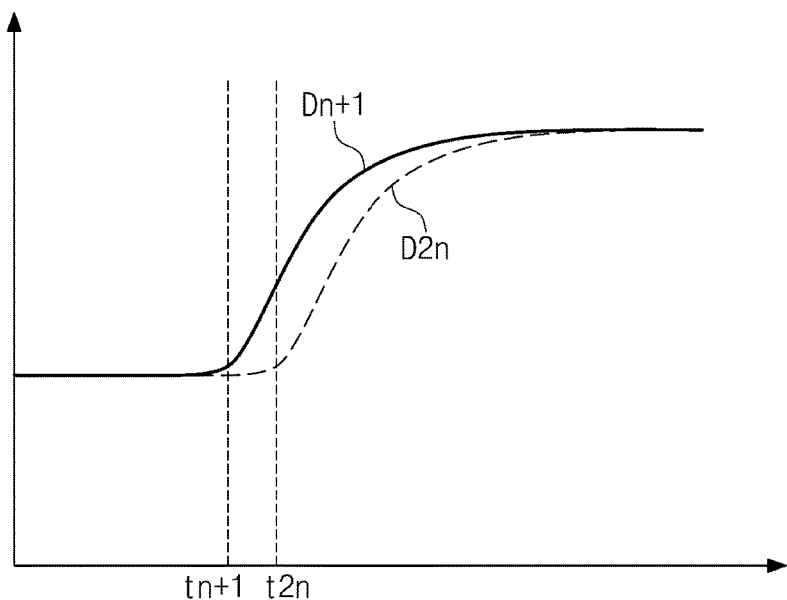

FIG. 4 is a block diagram showing another exemplary embodiment of a display apparatus according to the invention, and FIGS. 5A and 5B are waveform diagrams showing another exemplary embodiment of a delay of a data voltage output from first and second chips.

Referring to FIG. 4, the display apparatus according to the another exemplary embodiment further includes a printed circuit board 600 and a plurality of flexible films 650. The display apparatus includes a plurality of data drivers 401, 402, 403, and 404 mounted on the flexible films 650 respectively in a chip shape, and the flexible films 650 are disposed between the display panel 500 and the printed circuit board 600 and electrically connects the display panel 500 and the printed circuit board 600 in this exemplary embodiment.

In FIG. 4, the chips include first, second, third, and fourth data drivers 401, 402, 403, and 404, and the display panel 500 may include first, second, third, and fourth display regions DR1, DR2, DR3, and DR4 that receive the data voltages from the first, second, third, and fourth data drivers 401, 402, 403, and 404 respectively to display the image.

The gate driver 200 (refer to FIG. 1) may include a gate shift register 201 disposed at one side of the display panel 500 to apply the gate signal to the gate lines GL1 to GLm (refer to FIG. 1). As another exemplary embodiment of the invention, the gate shift register 201 may be provided in the display panel 500 through a thin film process.

In a case that the gate shift register 201 is disposed at the one ends adjacent to the first data driver 401 among both ends of the gate lines, the gate signal output from the gate shift register 201 may be delayed as it goes from the one ends of the gate lines to the other ends of the gate lines. The output time point of the data voltages output from the first, second, third, and fourth data drivers 401, 402, 403, and 404 may be determined based on the delay information of the gate signal.

First and second dummy lines L1 and L2 are disposed between two chips adjacent to each other among the first, second, third, and fourth data drivers 401, 402, 403, and 404. Since the gate shift register 201 is disposed at the one ends adjacent to the first data driver 401 and the gate signal output from the gate shift register 201 may be delayed as it goes from the one ends of the gate lines to the other ends of the gate lines, the delay information of the data voltages output from immediately previous chips are transmitted to the next chip via the first and second dummy lines L1 and L2. The delay information will be described in detail with reference to FIG. 6.

As shown in FIGS. 4 and 5A, the first data driver 401 outputs the first to n-th data voltages D1 to Dn during one horizontal period, and the output time point of the first to n-th data voltages D1 to Dn may be delayed as it goes from the first data line to the n-th data line. The first data voltage D1 is output to the first data line at a first rising time point t1, and the n-th data voltage Dn is output to the n-th data line at an n-th rising time point to delayed from the first rising time point t1 by a predetermined time.

As shown in FIGS. 4 and 5B, the second data driver 402 outputs n+1-th to 2 n-th data voltages Dn+1 to D2n during one horizontal period, and the output time point of the n+1-th to 2n-th data voltages Dn+1 to D2n may be delayed as it goes from an n+1-th data line to a 2n-th data line. The n+1-th data voltage Dn+1 is output to the n+1 data line at a n+1-th rising time point tn+1, and the 2n-th data voltage D2n is output to the 2n-th data line at a 2n-th rising time point t2n delayed from the n+1-th rising time point tn+1 by a predetermined time.

The n+1-th rising time point tn+1 may be a time point delayed from the n-th time point tn by another predetermined time, and a time interval (hereinafter, referred to as a "first time interval tn-t1") between the first rising time point t1 and the n-th rising time point tn may be different from a time interval (hereinafter, referred to as a "second time interval t2n-tn+1") between the n+1-th rising time point tn+1 and the 2n-th rising time point t2n. In this exemplary embodiment, the second time interval t2n-tn+1 may be smaller than the first time interval tj-t1.

The delay information provided from the first data driver 401 may be used to determine the n+1-th rising time point tn+1 by the second data driver 402. The delay information may include information about the first rising time point t1 and the n-th time point tn.

Figure 6:
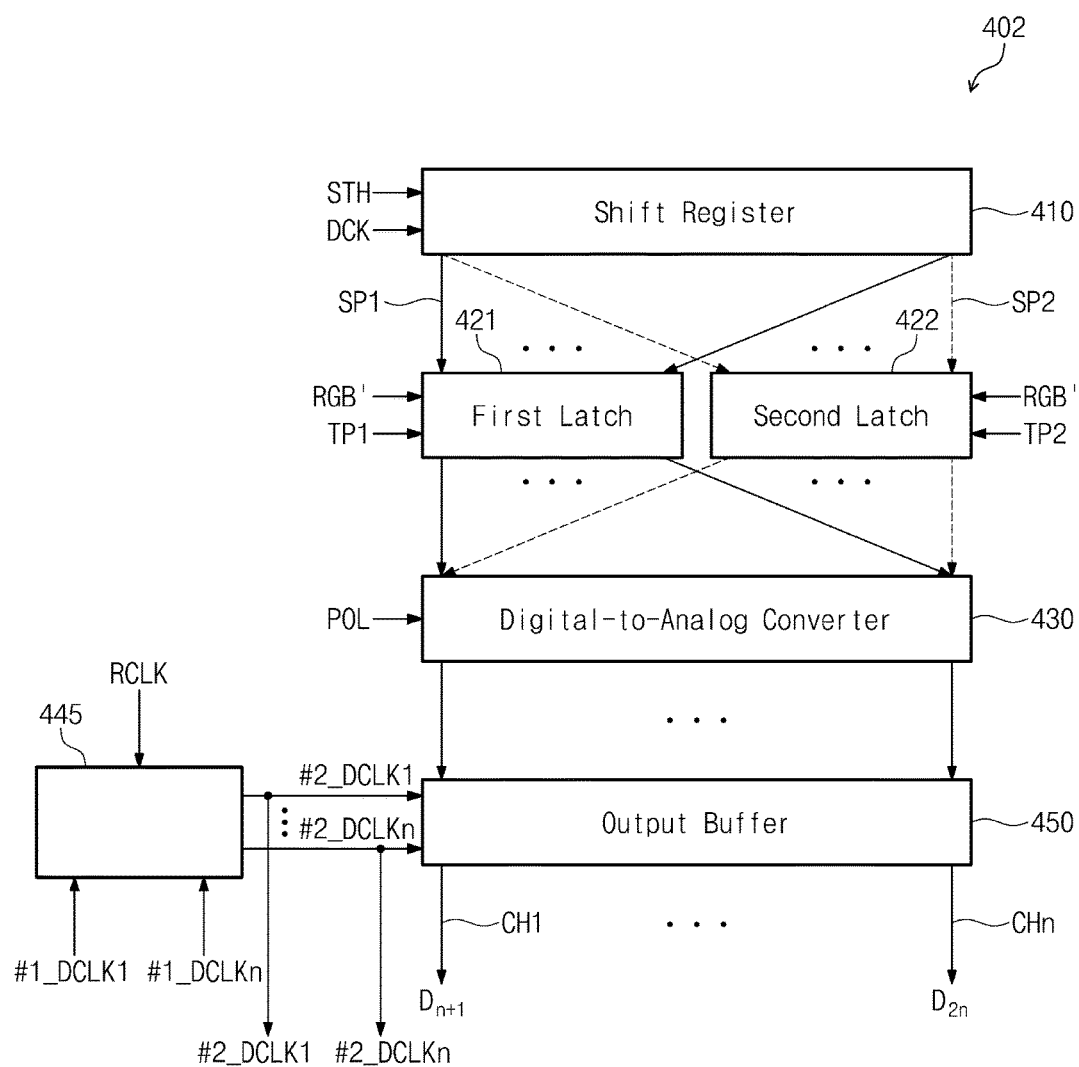
FIG. 6 is a block diagram showing an exemplary embodiment of the second chip shown in FIG. 4.

FIG. 6 is an internal block diagram showing an exemplary embodiment of the second chip 402 shown in FIG. 4. In FIG. 6, the second chip has similar internal configurations to those of the data driver shown in FIG. 2, and thus detailed descriptions of the similar internal configurations will be omitted in order to avoid redundancy.

Referring to FIG. 6, a delay clock generator 445 of the second data driver 402 receives first and n-th delay clock signals #1_DCLK1 and #1_DCLKn of the first data driver 401 from the first chip 401 through first and second dummy input channels, respectively. The delay clock generator 445 generates delay information of the first data driver 401 based on the first and n-th delay clock signals #1_DCLK1 and #1_DCLKn and reflects the delay information on the reference clock RCLK to generate first to n-th delay clock signals #2_DCLK1 to #2_DCLKn of the second data driver 402.

Accordingly, the first delay clock signal #2_DCLK1 of the second data driver 402 may be effectively prevented from occurring earlier in time than the n-th delay clock signal #1_DCLKn of the first data driver 401.

Among the first to n-th delay clock signals #2_DCLK1 to #2_DCLKn generated by the delay clock generator 445 of the second data driver 402, the first delay clock signal #2_DCLK1 and the n-th delay clock signal #2_DCLKn may be provided to the third chip 403 (refer to FIG. 4) adjacent to the second data driver 402 through first and second dummy output channels, respectively. The third data driver 403 generates delay information of the second chip 402 based on the first and n-th delay clock signals #2_DCLK1 and #2_DCLKj of the second chip 402 and reflects the delay information on the reference clock RCLK to generate first to j-th delay clock signals (not shown) of the third chip 403.

As described above, since the delay information about the adjacent chip may be reflected to generate the delay clock signal of the chip, a dim phenomenon may be effectively prevented from occurring at boundaries between the display regions DR1, DR2, DR3, and DR4.

Figure 7:
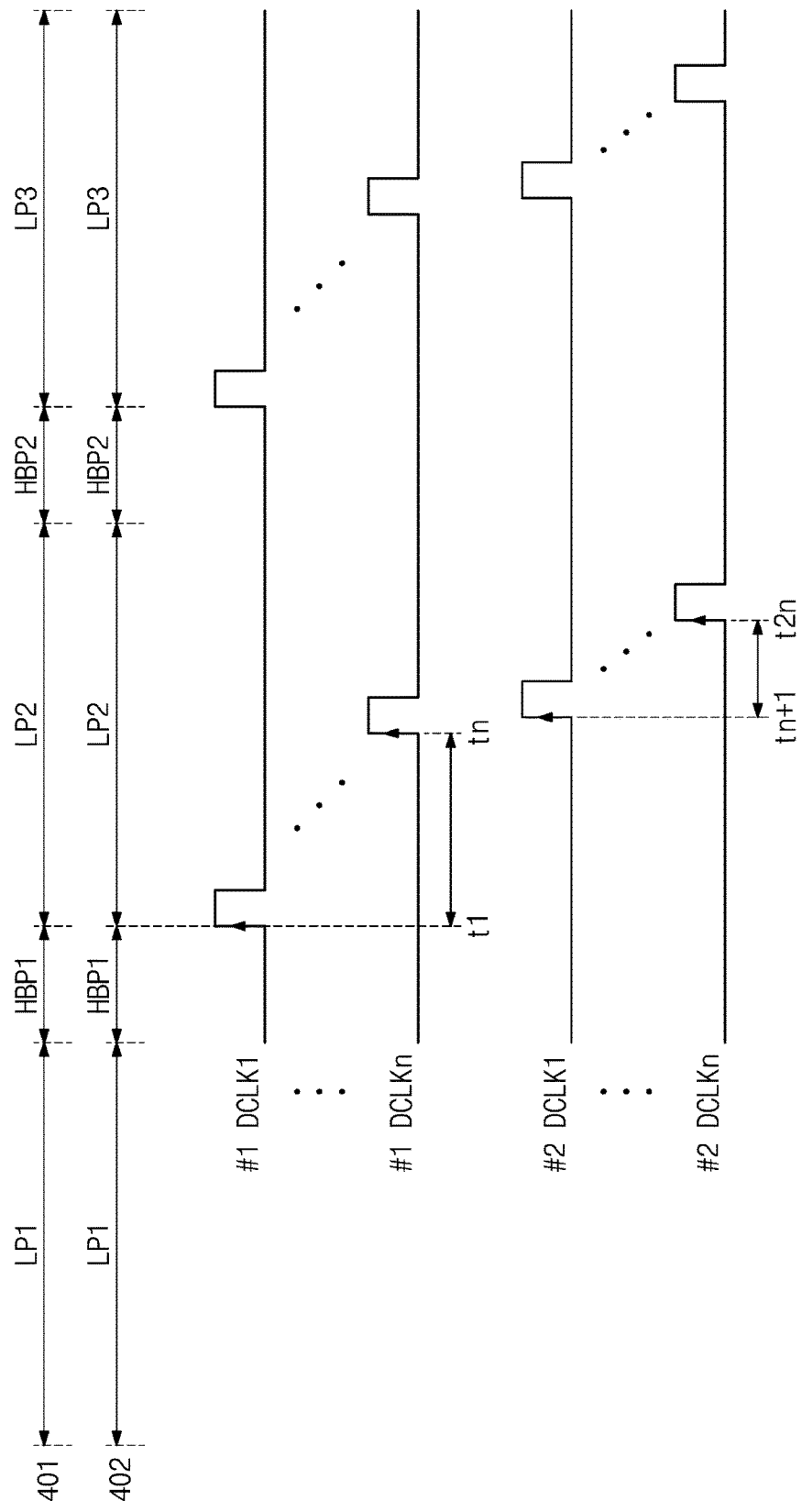
FIG. 7 is a waveform diagram explaining an exemplary embodiment of a latch operation of the first and second chips shown in FIG. 6.

FIG. 7 is a waveform diagram explaining an exemplary embodiment of a latch operation of the first and second data drivers 401 and 402 shown in FIG. 6. The latch operations of the first and second data drivers 401 and 402 are similar to that of the latch operation of the data driver 400 shown in FIG. 3, and thus details regarding similar portion will be omitted.

Referring to FIG. 7, the latch operations of the first and second data drivers 401 and 402 may be performed with no time difference since the delay effect will be added in the next step. That is, the latch operation of the first data driver 401 and the latch operation of the second data driver 402 may substantially simultaneously occur. However, unintentional time difference caused by a difference in position between the first and second data drivers 401 and 402 may occur between the latch operation of the first data driver 401 and the latch operation of the second data driver 402.

The first data voltage D1 starts to be output at a first rising time point t1 of the first delay clock signal #1_DCLK1 of the first chip 401, and the n-th data voltage Dn starts to be output at a n-th rising time point tn of the n-th delay clock signal #1_DCLKn of the first data driver 401.

The second data driver 402 may generate the first to n-th delay clock signals #2_DCLK1 to #2_DCLKn, which are delayed by predetermined times from the reference clock RCLK (refer to FIG. 6), using delay information thereof.

In addition, the second data driver 402 receives the first and n-th delay clock signals #1_DCLK1 and #1_DCLKn and calculates the delay time of the first data driver 401 based on the first and n-th delay clock signals #1_DCLK1 and #1_DCLKn. The second data driver 402 may delay the generated first to n-th delay clock signals #2_DCLK1 to #2_DCLKn by a time interval between the first rising time point t1 and the n-th rising time point tn of the first data driver 401 using the delay times.

Accordingly, the first to n-th delay clock signals #2_DCLK1 to #2_DCLKn of the second data driver 402 may be output after a predetermined time than the n-th delay clock signal #1_DCLKn of the first data driver 401.

The latch operation of the first data driver 401 and the latch operation of the second data driver 402 are substantially simultaneously occur, but the time point at which the data voltage of the second data driver 402 is output is delayed than the time point at which the data voltage of the first data driver 401 is output. In particular, a degree of delay of the second data driver 402 becomes greater than that of the first data driver 401. However, since the second data driver 402 includes two latches, present line data may be prevented from being changed to next line data. Accordingly, the second data driver 402 may output normal data voltages.

In addition, since the second data driver 402 receives the delay information of the first data driver 401 and generates the delay clock signal thereof, the delay time point of the second data driver 402 may be accurately controlled. Accordingly, a defect, such as the dim phenomenon, may be effectively prevented from occurring at the boundaries between the display regions DR1 to DR4.

Figure 8:
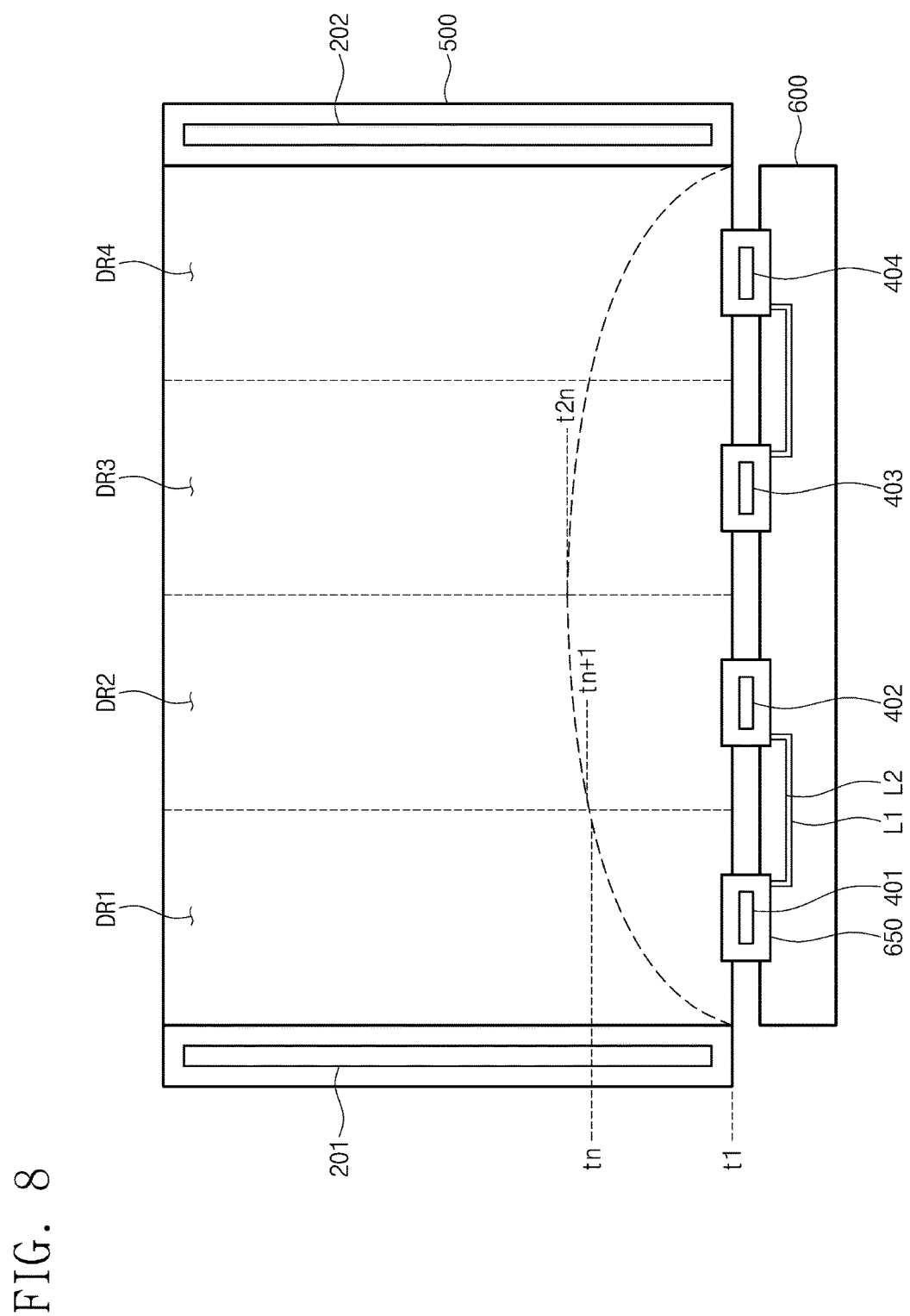
FIG. 8 is a block diagram showing still another exemplary embodiment of a display apparatus according to the invention.

FIG. 8 is a block diagram showing still another exemplary embodiment of a display apparatus according to the invention. In FIG. 8, the same reference numerals denote the same elements in FIG. 4, and thus detailed descriptions of the same elements will be omitted.

Referring to FIG. 8, the display apparatus includes a gate shift register 201 disposed at one end adjacent to the first data driver 401 among both ends of the gate line and a gate shift register 202 disposed at the other end adjacent to a fourth data driver 404 among both ends of the gate line.

A gate signal output from the gate shift register 201 is delayed as it goes from the one end of the gate line to a center portion of the gate line, and a gate signal output from the gate shift register 202 is delayed as it goes from the other end of the gate line to the center portion of the gate line.

The output time points of the data voltages output from the first, second, third, and fourth data drivers 401, 402, 403, and 404 may be determined based on the delay information of the gate signal.

In a case that a degree of delay of the gate signal is symmetrical with respect to the center portion, the delay information of the first data driver 401 is provided to the second data driver 402, and delay information of the fourth data driver 404 is provided to the third data driver 403.

In FIG. 8, the second and third data drivers 402 and 403 do not share the delay information with each other, but the way of sharing the delay information according to the invention should not be limited thereto or thereby.

Since the process in which the second data driver 402 receives the delay information of the first data driver 401 and is operated is described with reference to FIGS. 4 to 7, details thereof will be omitted. In addition, the process in which the third data driver 403 receives the delay information of the fourth data driver 404 and is operated is similar to the above-mentioned process of the second data driver 402, and thus details thereof will be omitted.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A data driver comprising:
   a first latch which sequentially stores first line data in response to a first sampling signal and outputs the stored data in parallel;
   a second latch which sequentially stores second line data in response to a second sampling signal and outputs the stored data in parallel;
   a digital-to-analog converter which converts the parallel data provided from one of the first and second latches to data voltages; and
   an output buffer which outputs the data voltages in response to a delay clock.

2. The data driver of claim 1, further comprising a shift register which alternately outputs the first sampling signal and the second sampling signal in response to a selection signal.

3. The data driver of claim 1, wherein the delay clock comprises first to n-th delay clock signals in which delay information is reflected respectively and which corresponds to first to n-th channels of the output buffer respectively, and the output buffer determines output time points of the data voltages output from the first to n-th channels in response to the first to n-th delay clock signals.

4. The data driver of claim 3, further comprising a delay clock generator which generates the first to n-th delay clock signals, in which the delay information of the first to n-th channels is reflected, based on a predetermined reference clock.

5. The data driver of claim 3, wherein the first line data are stored in the first latch during a first latch period, and a first output period during which the data voltages corresponding to the parallel data output from the first latch are output overlaps with a second latch period during which the second line data are stored in the second latch.

6. The data driver of claim 5, wherein a second output period during which the data voltages corresponding to the parallel data output from the second latch are output overlaps with a third latch period during which third line data are stored in the first latch.

7. The data driver of claim 5, wherein the first output period is a period from a rising edge of the first delay clock signal to a falling edge of the n-th delay clock signal.

8. A display apparatus comprising:
   a display panel which comprises a plurality of gate lines, a plurality of data lines, and a plurality of pixels connected to the gate lines and the data lines to display an image;
   a gate driver which generates a plurality of gate signals and applies the gate signals to the gate lines;
   a plurality of data drivers which generates a plurality of data voltages based on output image data and applies the data voltages to the data lines; and
   a signal controller which controls an operation of the gate driver and the data drivers and generates the output image data based on input image data,
   wherein each of the data drivers comprises first to n-th channels connected to corresponding data lines among the data lines, and each of the data drivers generates first to n-th delay clock signals in which delay information is reflected respectively and which correspond to the first to n-th channels and provides the first and n-th delay clock signals of the first to n-th delay clock signals to a next data driver in order among the data drivers.

9. The display apparatus of claim 8, wherein each of the data drivers further comprises:
   first and second dummy output channels which provides the first and n-th delay clock signals to the next data driver; and
   first and second dummy input channels which receives the first and n-th delay clock signals from a previous data driver in order among the data drivers.

10. The display apparatus of claim 9, wherein each of the data drivers comprises a delay clock generator which generates delay information based on the first and n-th delay clock signals of the previous data driver, reflects the delay information on a predetermined reference clock and generates the first to n-th delay clock signals.

11. The display apparatus of claim 8, wherein each of the data drivers comprises:
   a first latch which sequentially stores first line data in response to a first sampling signal and outputs the stored data in parallel;
   a second latch which sequentially stores second line data in response to a second sampling signal and outputs the stored data in parallel;
   a digital-to-analog converter which converts the parallel data provided from one of the first and second latches to data voltages; and
   an output buffer which outputs the data voltages in response to the first to n-th delay clock signals.

12. The display apparatus of claim 11, wherein each of the data drivers further comprises a shift register which alternately outputs the first sampling signal and the second sampling signal in response to a selection signal.

13. The display apparatus of claim 11, wherein the output buffer determines output time points of the data voltages output from the first to n-th channels in response to the first to n-th delay clock signals.

14. The display apparatus of claim 13, wherein each of the data drivers further comprises a delay clock generator which generates the first to n-th delay clock signals, in which the delay information of each of the first to n-th channels is reflected, based on a predetermined reference clock.

15. The display apparatus of claim 13, wherein the first line data are stored in the first latch during a first latch period, and a first output period during which the data voltages corresponding to the parallel data output from the first latch are output overlaps with a second latch period during which the second line data are stored in the second latch.

16. The display apparatus of claim 15, wherein a second output period during which the data voltages corresponding to the parallel data output from the second latch are output overlaps with a third latch period during which third line data are stored in the first latch.

17. The display apparatus of claim 15, wherein the first output period is a period from a rising edge of the first delay clock signal to a falling edge of the n-th delay clock signal.

18. A display apparatus comprising:
   a display panel which comprises a plurality of gate lines, a plurality of data lines, and a plurality of pixels connected to the gate lines and the data lines to display an image;

a gate driver which generates a plurality of gate signals and applies the gate signals to the gate lines;

a plurality of data drivers which generates a plurality of data voltages based on output image data and applies the data voltages to the data lines; and a signal controller which controls an operation of the gate driver and the data drivers and generates the output image data based on input image data, wherein each of the data drivers comprises:

first to n-th channels connected to corresponding data lines among the data lines;

a first latch which sequentially stores first line data in response to a first sampling signal and outputs the stored data in parallel;

a second latch which sequentially stores second line data in response to a second sampling signal and outputs the stored data in parallel;

a digital-to-analog converter which converts the parallel data provided from one of the first and second latches to data voltages; and an output buffer which outputs the data voltages in response to a delay clock.

19. The display apparatus of claim 18, wherein the delay clock comprises first to nj-th delay clock signals, and each of the data drivers generates the first to n-th delay clock signals, in which delay information of each of the first to n-th channels is reflected, based on a predetermined reference clock.

20. The display apparatus of claim 18, wherein the first line data are stored in the first latch during a first latch period, a first output period during which the data voltages corresponding to the parallel data output from the first latch are output overlaps with a second latch period during which the second line data are stored in the second latch, and a second output period during which the data voltages corresponding to the parallel data output from the second latch are output overlaps with a third latch period during which third line data are stored in the first latch.

* * * * *